United States Patent [19]
Kubo

[11] Patent Number: 5,786,275
[45] Date of Patent: Jul. 28, 1998

[54] PROCESS OF FABRICATING WIRING STRUCTURE HAVING METAL PLUG TWICE POLISHED UNDER DIFFERENT CONDITIONS

[75] Inventor: Akira Kubo, Tokyo, Japan

[73] Assignee: NEC Corporation, Japan

[21] Appl. No.: 865,889

[22] Filed: May 30, 1997

[30] Foreign Application Priority Data

Jun. 4, 1996 [JP] Japan ..................... 8-141656

[51] Int. Cl.⁶ ..................................... H01L 21/00
[52] U.S. Cl. .................. 438/692; 216/38; 216/88; 438/756
[58] Field of Search ................ 216/38, 52, 88–90; 438/691, 692, 747, 756, 754

[56] References Cited

U.S. PATENT DOCUMENTS

| 4,992,135 | 2/1991 | Doan ........................... 156/636 |
| 5,244,534 | 9/1993 | Yu et al. ...................... 216/88 X |
| 5,665,202 | 9/1997 | Subramanian et al. ......... 216/88 X |

FOREIGN PATENT DOCUMENTS

| 6455845 | 3/1989 | Japan. |
| 4167448 | 6/1992 | Japan. |
| 4233224 | 8/1992 | Japan. |
| 5275366 | 10/1993 | Japan. |
| 88218 | 1/1996 | Japan. |
| 8124886 | 5/1996 | Japan. |
| 9167768 | 6/1997 | Japan. |

*Primary Examiner*—William Powell
*Attorney, Agent, or Firm*—Hayes, Soloway, Hennessey, Grossman & Hage, P.C.

[57] ABSTRACT

A tungsten layer swells out from a contact hole into a tungsten layer on an inter-level insulating layer, and the tungsten layer is chemically mechanically polished so as to create s smooth top surface of the tungsten plug substantially coplanar with the upper surface of the inter-level insulating layer; the chemical mechanical polishing is changed from mild conditions to severe conditions at an intermediate point so that a shallow recess and scratches are not produced in the top surface of the inter-level insulating layer; the polishing speed, the particle size of powder in polishing slurry, the hydrogen ion concentration of the polishing slurry and additives are examples of the polishing condition to be controlled.

13 Claims, 10 Drawing Sheets

PROCESS OF FABRICATING WIRING STRUCTURE HAVING METAL PLUG TWICE POLISHED UNDER DIFFERENT CONDITIONS

FIELD OF THE INVENTION

This invention relates to a process of fabricating a wiring structure and, more particularly, to a process of fabricating a wiring structure having a metal plug twice polished under different conditions.

DESCRIPTION OF THE RELATED ART

A typical example of the process is disclosed in Japanese Patent Publication of Unexamined Application No. 4-167448, and the prior art process is illustrated in FIGS. 1A to 1E. Description is firstly made on the prior art process.

Firstly, first-level metal wirings 2a and 2b are patterned on the major surface of a semiconductor wafer 2 as shown in FIG. 1A, and the first-level metal wirings 1a/1b are 800 nanometers thick. Silicon oxide is deposited to 1500 nanometers thick over the entire surface of the resultant structure by using a plasma-assisted chemical vapor deposition, and the first level metal wirings 1 a/1b are covered with a silicon oxide layer 3. The top surface of the silicon oxide layer 3 is waved due to the first level wirings 1a/1b.

A photo-resist etching mask (not shown) is formed on the silicon oxide layer 3, and predetermined areas are exposed to openings of the photo-resist etching mask. Using the photo-resist etching mask, the silicon oxide layer 3 is selectively etched away so as to form contact holes 3a/3b/3c in the silicon oxide layer 3 as shown in FIG. 1B.

Subsequently, tungsten is selectively grown in the contact holes 3a/3b/3c by using a low-pressure chemical vapor deposition, and fills the contact holes 3a/3b/3c as shown in FIG. 1C. Thus, the contact holes 3a/3b/3c are plugged with pieces of tungsten or tungsten plugs 4a/4b/4c. The tungsten may deposited over the entire surface of the resultant semiconductor structure shown in FIG. 1B.

The waved surface of the resultant semiconductor structure is mechanically polished so as to create a smooth surface 3d as shown in FIG. 1D. Hard polishing powder of $Al_2O_3$ is used for the mechanical polishing.

Finally, conductive metal is deposited to 900 nanometers thick over the entire smooth surface 3d by using a sputtering, and the entire smooth surface 3d is covered with a conductive metal layer 5 as shown in FIG. 1E.

Another prior art process is disclosed in Japanese Patent Publication of Unexamined Application No. 5-275366, and FIGS. 2A to 2C illustrate the prior art process.

A semiconductor wafer 10 is covered with a boro-phospho-silicate glass layer 11, and a contact hole 11a is formed in the boro-phospho-silicate glass layer 11. Tungsten is deposited over the entire surface of the resultant semiconductor structure by using a chemical vapor deposition. The tungsten fills the contact hole 11a, and swells into a tungsten layer 12 of 1000 nanometers thick as shown in FIG. 2A.

Subsequently, the tungsten layer 12 is chemically mechanically polished on a rotating polishing pad, and slurry is supplied to the polishing pad. The slurry contains polishing powder of $Al_2O_3$ and acid such as $H_2O_2$, KOH or $NH_4OH$ or suitable base, and selectively polishes the tungsten layer 12. The slurry is disclosed in U.S. Pat. No. 4,992,135. As a result, the tungsten plug 12a is left in the contact hole 11a, and the top surface of the tungsten plug 12a is depressed from the top surface of the boro-phospho-silicate glass layer 11 as shown in FIG. 2B.

Subsequently, the boro-phospho-silicate glass layer 11 is chemically mechanically polished by using colloidal silica slurry effective against the boro-phospho-silicate glass. The colloidal silica slurry contains $H_2O_2$ or KOH. The boro-phospho-silicate glass layer 11 is selectively polished, and the top surface 12b of the tungsten plug 12a slightly projects from the top surface 11a of the boro-phospho-silicate glass layer 11 as shown in FIG. 2C. A metal wiring on the boro-phospho-silicate glass layer 11 is surely brought into contact with the tungsten plug 12a slightly projecting from the top surface 11a.

The first prior art process encounters a problem in a disconnection between the tungsten plugs 4a/4b/4c and the second level wirings patterned from the conductive metal layer 5. This is because of the fact that the tungsten plugs 4a/4b/4c are depressed from the top surface of the silicon oxide layer 3.

Another problem inherent in the first prior art process is scratches and a shallow recess 3a formed in a wide area 3b of the silicon oxide layer 3 as shown in FIG. 3. The shallow recess 3a is formed during the polishing due to the hard polishing powder of $Al_2O_3$. The scratches and the shallow recess 3a is causative of mis-alignment during a lithography.

On the other hand, the second prior art process eliminates the step between the tungsten plug 12a and the boro-phospho-silicate glass layer 11 from the resultant semiconductor structure. However, the boro-phospho-silicate glass layer 11 is still scratched by the hard alumina powder, and a shallow recess also takes place in a wide area of the boro-phospho-silicate glass layer 11. The shallow recess and the scratches are causative of the mis-alignment in a lithography.

Moreover, the second prior art process encounters a second problem in the tungsten plug 12a slightly projecting from the upper surface of the boro-phospho-silicate glass layer 11, because the hard tungsten plug 12a is hardly polished in the soft silica slurry. Therefore, the second prior art process hardly creates a perfectly smooth top surface of the semiconductor structure.

SUMMARY OF THE INVENTION

It is therefore an important object of the present invention to provide a process of fabricating a wiring structure which creates a smooth top surface of an insulating layer coplanar with a top surface of a conductive plug member without a shallow recess, scratches and a step between a plug and an insulating layer.

The present inventor contemplated the problems, and investigated the polishing conditions of the chemical mechanical polishing. The present inventor noticed that the shallow recess and the scratches did not take place under milder polishing conditions. The polishing speed, the particle size of polishing powder, the hydrogen ion concentration of polishing slurry and additives in the polishing slurry were examples of the polishing condition. The present inventor concluded that a changed from severe conditions to mild conditions at an intermediate point of the chemical mechanical polishing solved the problems.

In accordance with the present invention, there is provided a process of fabricating a wiring structure, comprising the steps of: a) forming at least one opening in an inter-level insulating layer over a substrate; b) growing conductive metal in the at least one opening in such a manner that a piece of the conductive metal has a projection over an upper surface of the inter-level insulating layer; c) polishing an upper portion of the projection under severe conditions; and d) polishing a remaining portion of the projection under mild conditions until the piece of the conductive metal becomes coplanar with the upper surface of the inter-level insulating layer.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

Figure 1A:
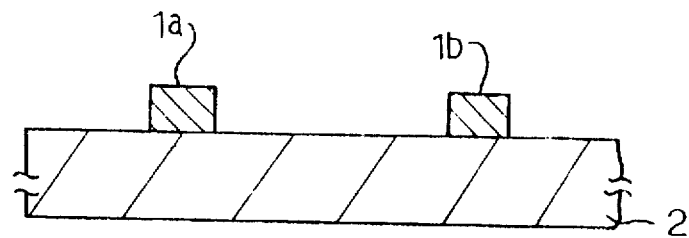
FIGS. 1A to 1E are cross sectional views showing the first prior art process disclosed in Japanese Patent Publication of Unexamined Application No. 4-167448.
Figure 1B:
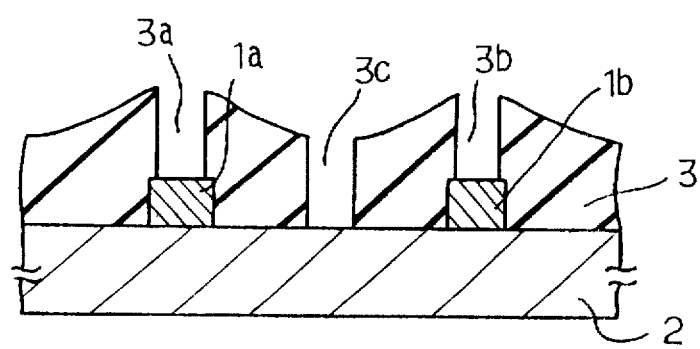
Figure 1C:
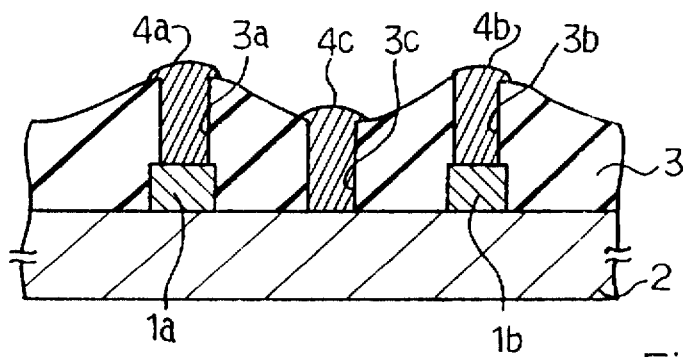
Figure 1D:
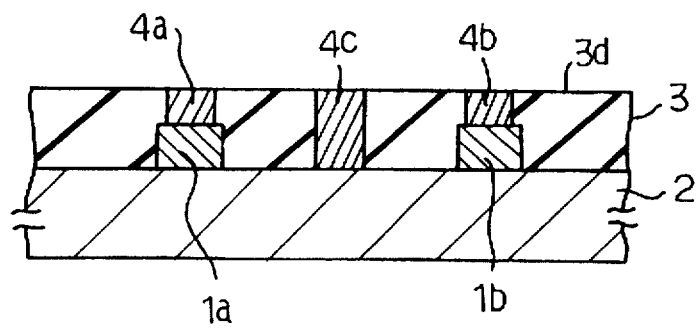
Figure 1E:
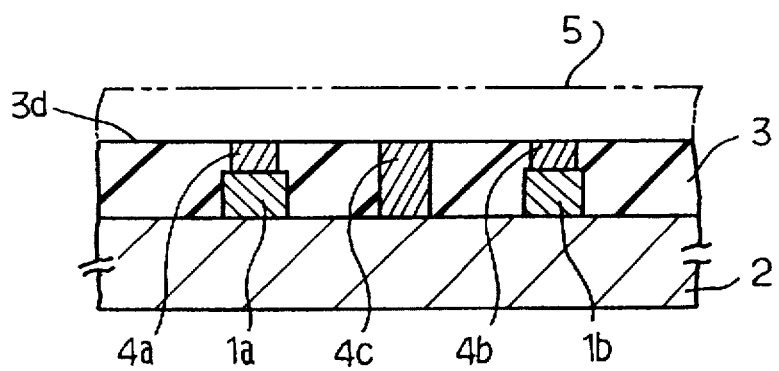
Figure 2A:
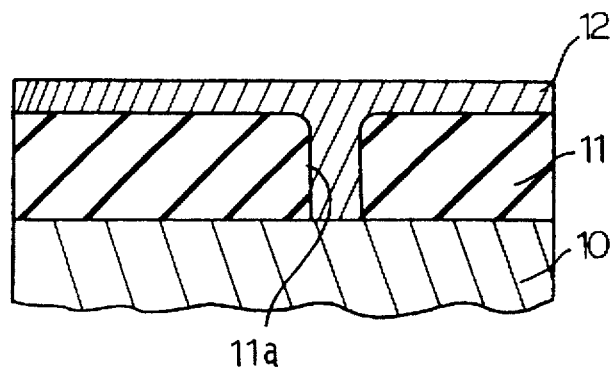
FIGS. 2A to 2C are cross sectional views showing the second prior art process disclosed in Japanese Patent Publication of Unexamined Application No. 5-275366.
Figure 2B:
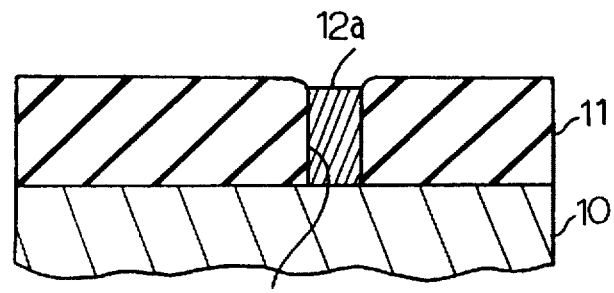
Figure 2C:
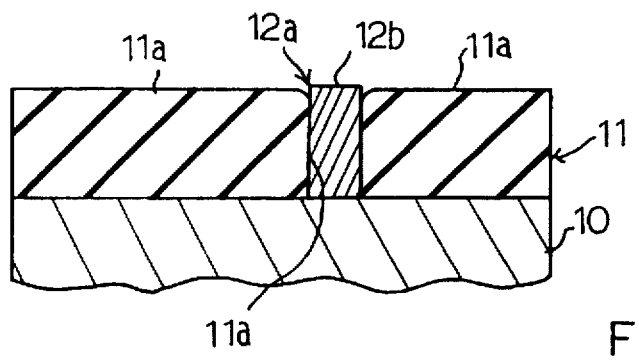
Figure 3:
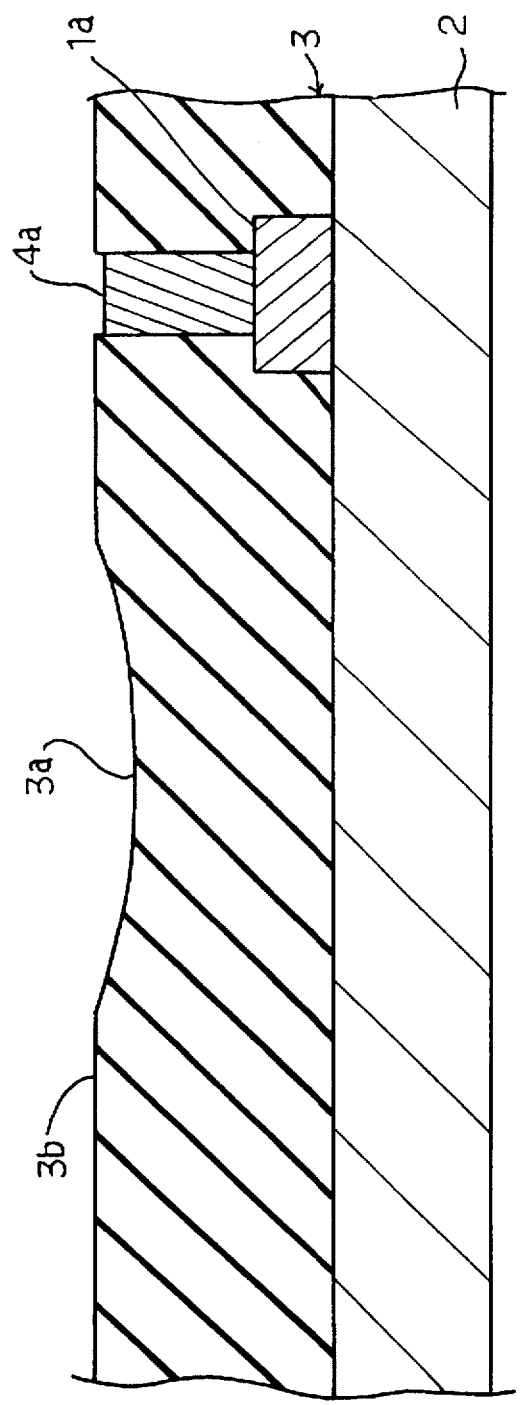
FIG. 3 is a cross sectional view showing the shallow recess undesirably formed during the first prior art process sequence.

A process embodying the present invention starts with preparation of a semiconductor substrate 21 such as a silicon wafer. Though not shown in FIGS. 4A to 4D, circuit components of an integrated circuit such as, for example, transistors are fabricated on the semiconductor substrate 21.

The major surface of the semiconductor substrate 21 is covered with a lower inter-level insulating layer 22a, and a lower conductive wiring 23a is patterned on the lower inter-level insulating layer 22a. The lower conductive wiring 23a has a multi-layered structure. A titanium layer 23b is laminated with a titanium nitride layer 23c which in turn is laminated with an aluminum-silicon-copper alloy layer 23d. The aluminum-silicon-copper alloy layer 23d is overlain by a titanium nitride layer 23e.

Silicon oxide is deposited over the entire surface of the resultant semiconductor structure by using a plasma-assisted chemical vapor deposition, and the lower conductive wiring 23a and the upper surface of the lower inter-level insulating layer 22a around the wiring 23a are covered with an upper inter-level insulating layer 22b. Photo-resist solution is spun onto the upper inter-level insulating layer 22b, and is baked so as to form a photo-resist layer on the upper inter-level insulating layer 22b. A pattern image is optically transferred to the photo-resist layer, and a latent image is formed therein. The latent image is developed so as to provide a photo-resist etching mask (not shown) on the upper inter-level insulating layer 22b. Using the photo-resist etching mask, the upper inter-level insulating layer 22b is selectively etched away, and a primary through-hole 22c is formed in the upper inter-level insulating layer 22b. Thus, the primary through-hole 22c is formed by using the lithography and the etching. The titanium nitride layer 23e is exposed to the primary through-hole 22c. In this instance, the primary through-hole 22c is 400 nanometers in diameter.

Subsequently, titanium is deposited to 30 nanometers thick, and a titanium layer 24a topographically extends along the exposed surface of the resultant semiconductor structure. The titanium layer 24a is held in contact with the titanium nitride layer 5 exposed to the bottom of the primary through-hole 22c.

Figure 4A:
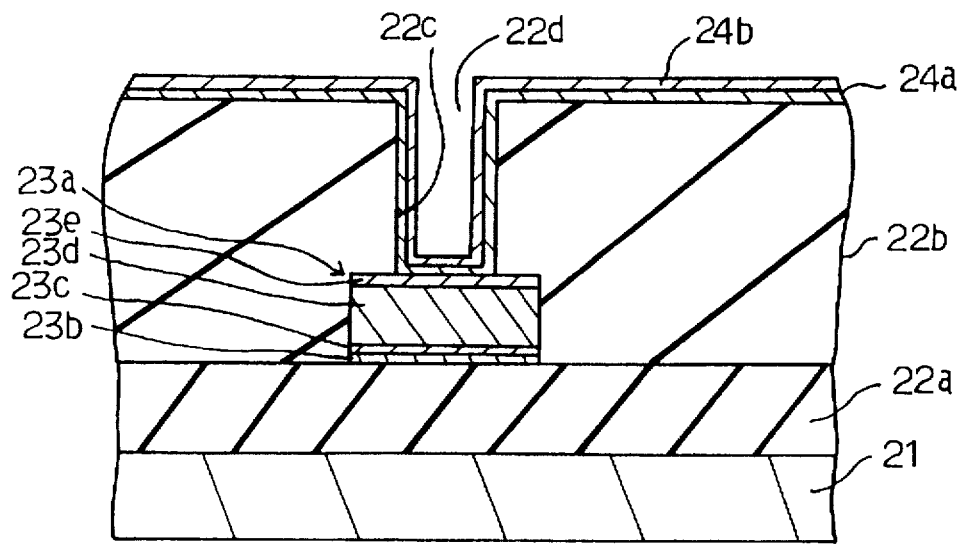
FIGS. 4A to 4D are cross sectional views showing a process sequence according to the present invention.
Figure 4B:
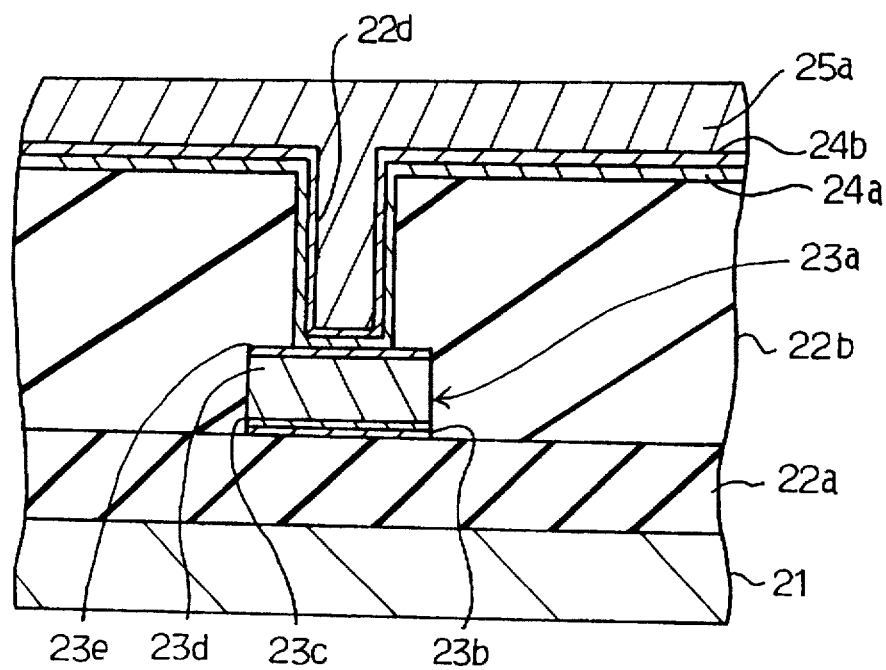

Titanium nitride is deposited to 100 nanometers thick over the titanium layer 24a, and forms a titanium nitride layer 24b on the titanium layer 24a. The titanium nitride layer 24b defines a secondary hole 22d in the primary through-hole 22c as shown in FIG. 4A.

Subsequently, tungsten is deposited over the entire surface of the resultant structure by using a chemical vapor deposition at 415 degrees in centigrade. The tungsten fills the secondary hole 22d, and swells into a tungsten layer 25a of 500 nanometers thick.

Subsequently, the resultant semiconductor structure is retained by a carrier of a chemical mechanical polishing apparatus (not shown). The carrier presses the tungsten layer 25a against a polishing pad, and is rotated together with the resultant semiconductor structure. Slurry is supplied onto the polishing pad, and the polishing pad is driven for rotation by a platen roller so as to chemically mechanically polish the tungsten layer 25a until the tungsten layer 25b is decreased to 100 nanometers thick.

The polishing conditions are as follows. The platen roller is rotated at 50 rpm, and the carrier is rotated at 40 rpm. The down press is 5.0 psi, ad the back press is 2.5 psi. The flow rate of the slurry is 200 cc/min. The slurry contains alumina powder and oxidant, and pH value is regulated to 3.5. The particle size of the alumina powder is 200 nanometers, and the oxidant is $H_2O_2$. The polishing pad has two-layer structure. The lower layer is formed from non-woven fabric cloth of wet polyurethane foam, and is overlain by an upper hard polishing cloth of dry foam. Thus, the polishing conditions are severe, and the polishing under the severe conditions is referred to as "first stage".

Figure 4C:
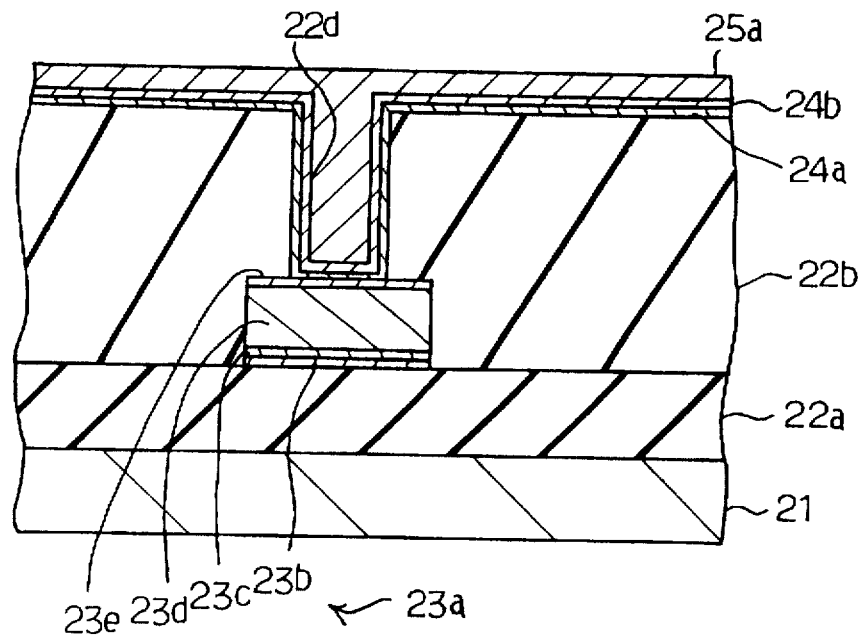
Figure 5:
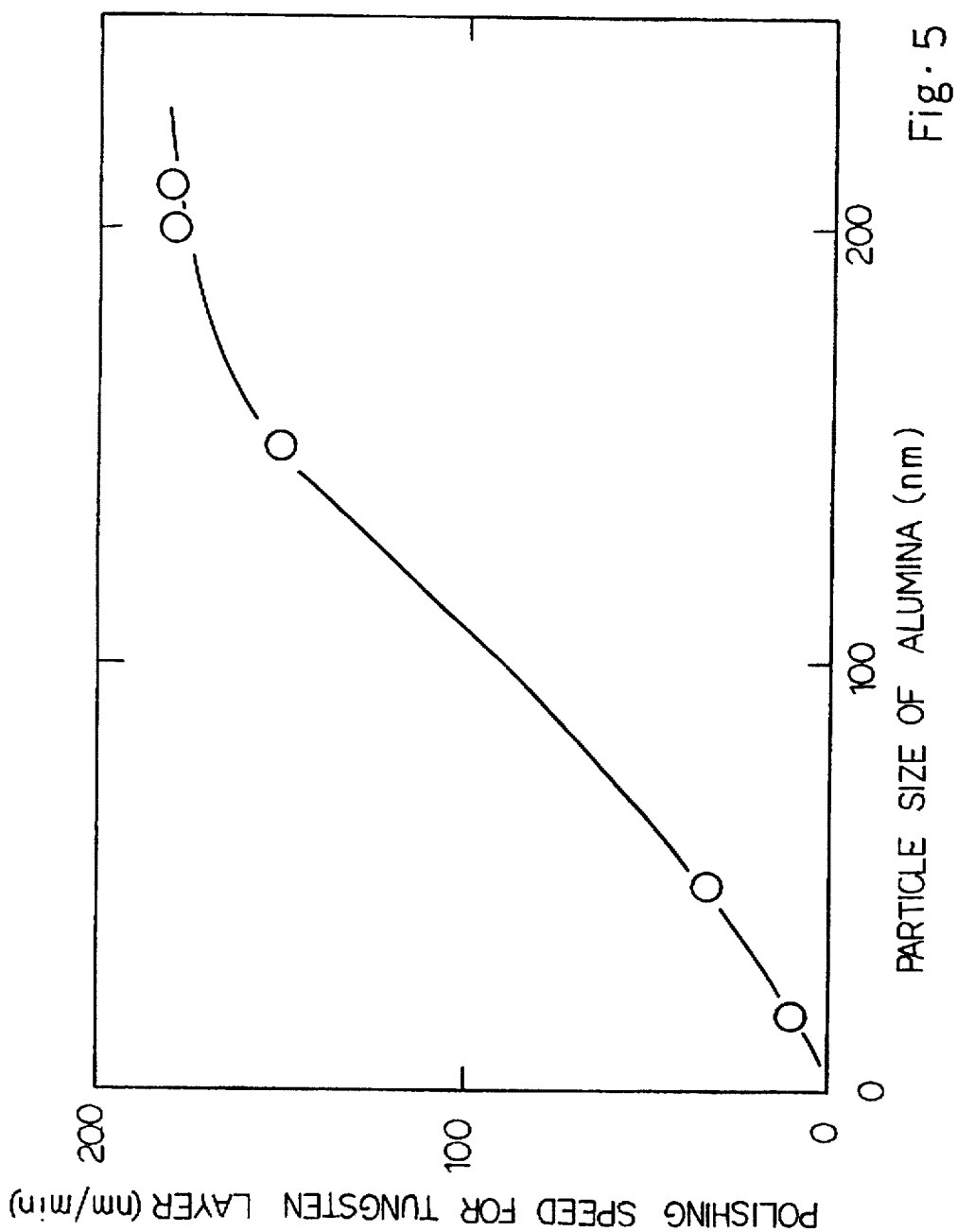
FIG. 5 is a graph showing relation between a polishing speed and particle size of alumina powder.

When a tungsten layer is polished under the above severe conditions, the polishing speed is about 190 nanometers per minute (see FIG. 5). For this reason, the polishing conditions are changed from the severe conditions to mild conditions at about 2 minutes without an interruption of the polishing. When the polishing conditions are changed, the tungsten layer 25a is decreased to about 100 nanometers thick as shown in FIG. 4C, and the second stage follows the first stage under mild polishing conditions.

The mild polishing conditions are as follows. The platen roller is rotated at 20 rpm, and the carrier is rotated at 40 rpm. The down press is 5.0 psi, and the back press is 2.5 psi. The flow rate of the slurry is 200 cc/min. The polishing slurry is not changed. The polishing speed is decreased to about 100 nanometers per minute, because the platen roller is decelerated to 20 rpm.

Figure 4D:
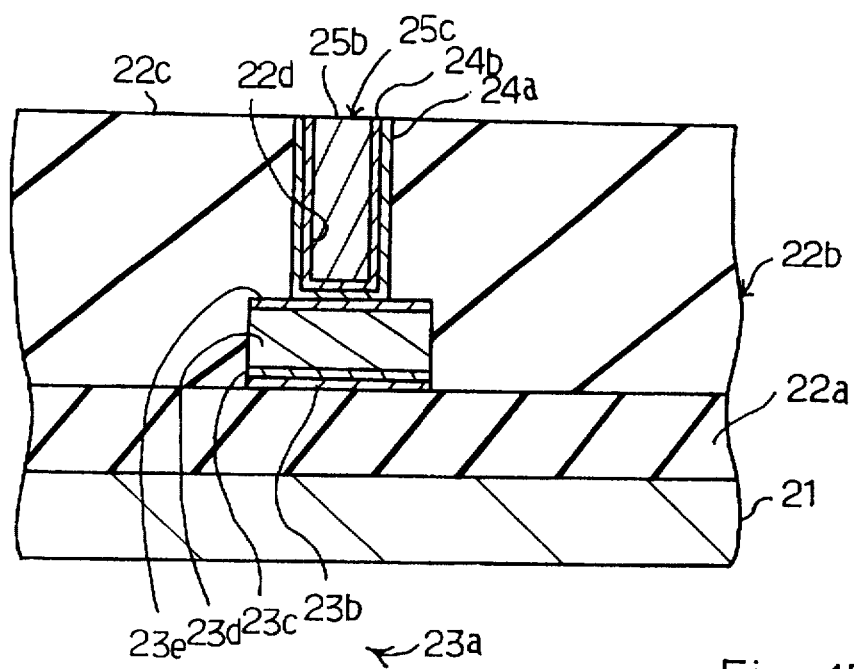

The torque current of the motor coupled to the carrier is monitored to see whether or not the insulating layer 22b is exposed. When the torque current is changed, the top surface 22c of the insulating layer 22b becomes substantially coplanar with the top surface 25b of a tungsten plug 25c left in the secondary hole 22d as shown in FIG. 4D.

The second stage of the polishing is so mild that the insulating layer 22b is polished by only several nanometers.

Figure 6:
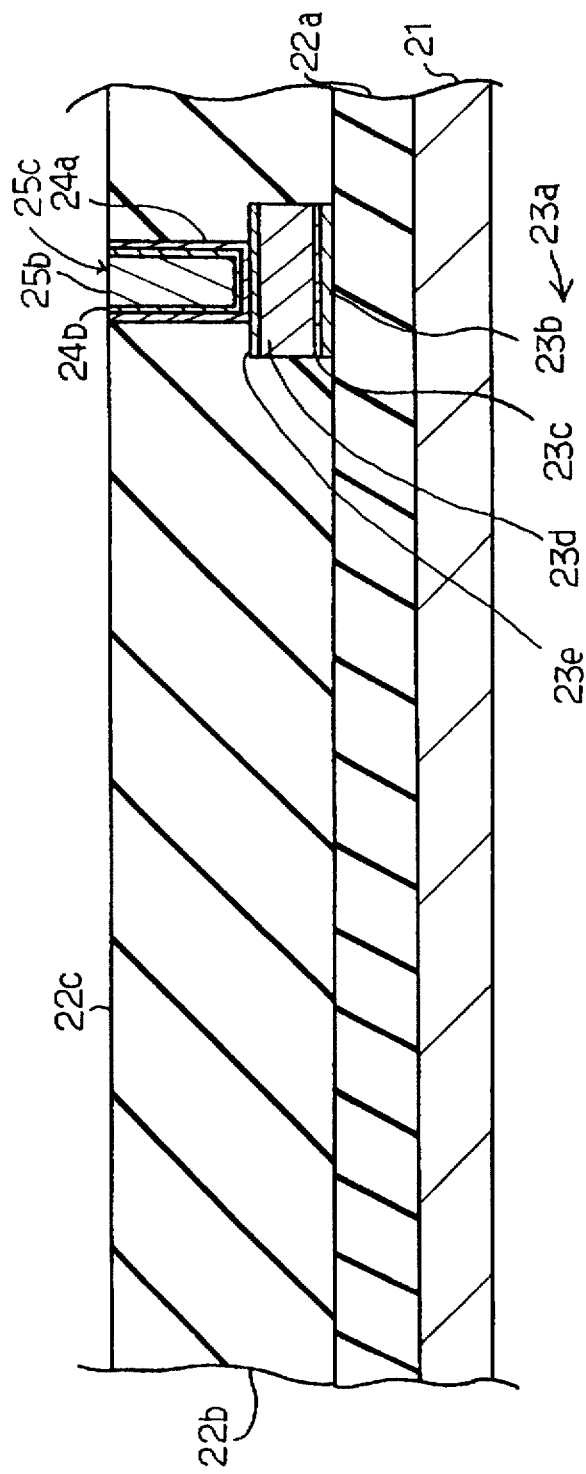
FIG. 6 is a cross sectional view showing a semiconductor structure upon completion of a two-stage polishing.

For this reason, the insulating layer 22b is not depressed as shown in FIG. 6, and few scratches are observed on the top surface 22c.

The present inventor investigated the polishing speeds in the first and second stages effective against the shallow recess, the scratches and a step between the tungsten plug and the insulating layer. When the polishing speed in the first stage and the polishing speed in the second stage range between 150 nm/min and 400 nm/min and between 50 nm/min and 100 nm/min, the ratio of the polishing speed in the second stage to the polishing speed in the first stage at 70 percent or less was effective against the shallow recess, the scratches and the step between the top surfaces 22c and 25b. On the other hand, when the ratio exceeds 70 percent, the shallow recess, the scratches and the step were observed.

The present inventor confirmed that the above described two-stage polishing was available for layers formed of copper, aluminum alloy, titanium alloy, silicon and compound containing at least one of tungsten, copper, aluminum alloy, titanium alloy and silicon. The present inventor changed the oxidant from $H_2O_2$ to another one, and achieved the same result.

Second Embodiment

Another process implementing the second embodiment also traces the steps shown in FIGS. 4A to 4D. In this instance, the particle size of polishing powder is changed between the first stage and the second stage.

The polishing conditions in the first stage is identical with those of the first embodiment. When the first stage of the polishing is completed, the polishing slurry is changed. The polishing slurry used in the second stage contains fine alumina powder, and the fine alumina powder has the particle size of 50 nanometers. The polishing speed in the second stage is decreased to 35 nm/min which is about 20 percent of the polishing speed in the first stage.

The torque current is also monitored so as to defect the end point of the second stage. A shallow recess and a step do not take place, and few scratches are observed.

The present inventor investigated the particle sizes in the first and second stages effective against the shallow recess, the scratches and a step between the tungsten plug and the insulating layer. When the particle size in the first stage and the particle size in the second stage range between 150 nanometers and 200 nanometers and between 20 nanometers and 100 nanometers, the ratio of the particle size in the second stage to the particle size in the first stage at 50 percent or less was effective against the shallow recess, the scratches and the step between the top surfaces 22c and 25b. On the other hand, when the ratio exceeds 50 percent, the shallow recess, the scratches and the step were observed.

The present inventor confirmed that the above described two-stage polishing was available for layers formed of copper, aluminum alloy, titanium alloy, silicon and compound containing at least one of tungsten, copper, aluminum alloy, titanium alloy and silicon. The present inventor changed the oxidant from $H_2O_2$ to another one, and achieved the same result.

Third Embodiment

Yet another process embodying the present invention traces the above described steps until the completion of the first stage of polishing. In this instance, the hydrogen ion concentration is controlled between the first stage and the second stage.

Upon completion of the first stage of the polishing, the carrier is lifted so as to space the semiconductor structure from the polishing pad for 30 seconds. While the semiconductor structure is being spaced from the polishing pad, the polishing pad is cleaned by using pure water. The pure water removes the acid slurry used in the first stage.

Neutral colloidal silica slurry is supplied to the polishing pad in the polishing pad during the second stage of polishing. The neutral colloidal silica slurry contains silica powder, and the silica powder has the particle size of the order of 90 nanometers. The other polishing conditions are identical with those of the first stage.

Figure 7:
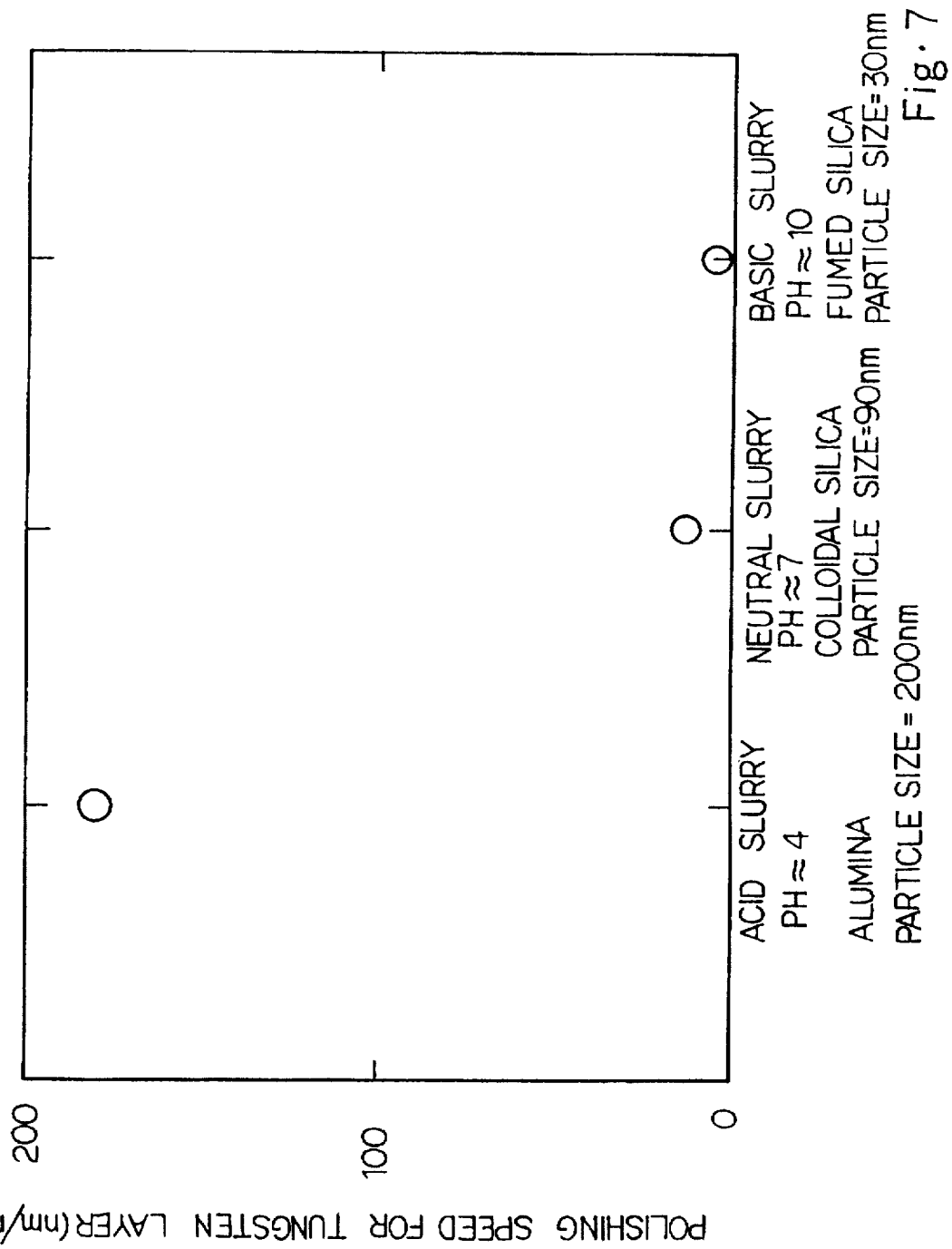
FIG. 7 is a graph showing the relation between the hydrogen ion concentration of polishing slurry and a polishing speed.

As shown in FIG. 7, when the acid slurry is replaced with the neutral slurry, the polishing speed is decreased to 12 nm/min, which is only 5 percent in the first stage, and the polishing conditions become milder. The torque current is monitored so as to detect an end timing of the second stage of the polishing.

The second stage of the polishing is so mild that a shallow recess, the scratches and the step hardly take place in the insulating layer 22b. The top surface 25b of the tungsten plug 25c is coplanar with the top surface 22c of the insulating layer 22b.

The present inventor investigated appropriate hydrogen ion concentration for the first stage and the second stage. Appropriate pH ranges were 3 to 5 for the first stage and 7 to 14 for the second stage. Thus, the polishing slurry with large pH value made the polishing mild, and was effective against the shallow recess, the scratches and the step. Recommendable acid polishing slurry between pH3 to pH5 was, by way of example, mixture between solution of alumina powder and solution of iron nitride and mixture between the solution of alumina powder and solution of potassium iodate. Recommendable neutral/basic slurry between pH7 to pH14 was, by way of example, fumed silica solution and cerium oxide solution.

The present inventor confirmed that the above described two-stage polishing was available for layers formed of copper, aluminum alloy, titanium alloy, silicon and compound containing at least one of tungsten, copper, aluminum alloy, titanium alloy and silicon. The present inventor changed the oxidant from $H_2O_2$ to another one, and achieved the same result.

Fourth Embodiment

Still another process embodying the present invention also traces the steps shown in FIGS. 4A to 4D. In this instance, additives are changed between the first stage and the second stage.

The polishing conditions in the first stage are as follows. The platen roller is rotated at 50 rpm, and the carrier is rotated at 40 rpm. The down press is 5.0 psi, ad the back press is 2.5 psi. The flow rate of the slurry is 200 cc/min. The particle size of the alumina powder is 50 nanometers. The polishing pad has two-layer structure. The lower layer is formed from non-woven fabric cloth of wet polyurethane foam, and is overlain by an upper hard polishing cloth of dry foam. Thus, the polishing conditions are severe.

The slurry contains alumina powder, $H_2O_2$ and inorganic compound. The inorganic compound disperses the alumina powder in the polishing slurry. In this instance, the polishing slurry contains potassium nitride at 3 percent and ammonium chloride at 3 percent both serving as dispersant. The usage of the slurry results in the polishing speed of about 60 nm/min as indicated by left small circle in FIG. 8, and the first stage of the polishing is completed at 6 minutes from the start. When the first stage is completed, the tungsten layer 25a is decreased to 100 nanometers thick.

Figure 8:
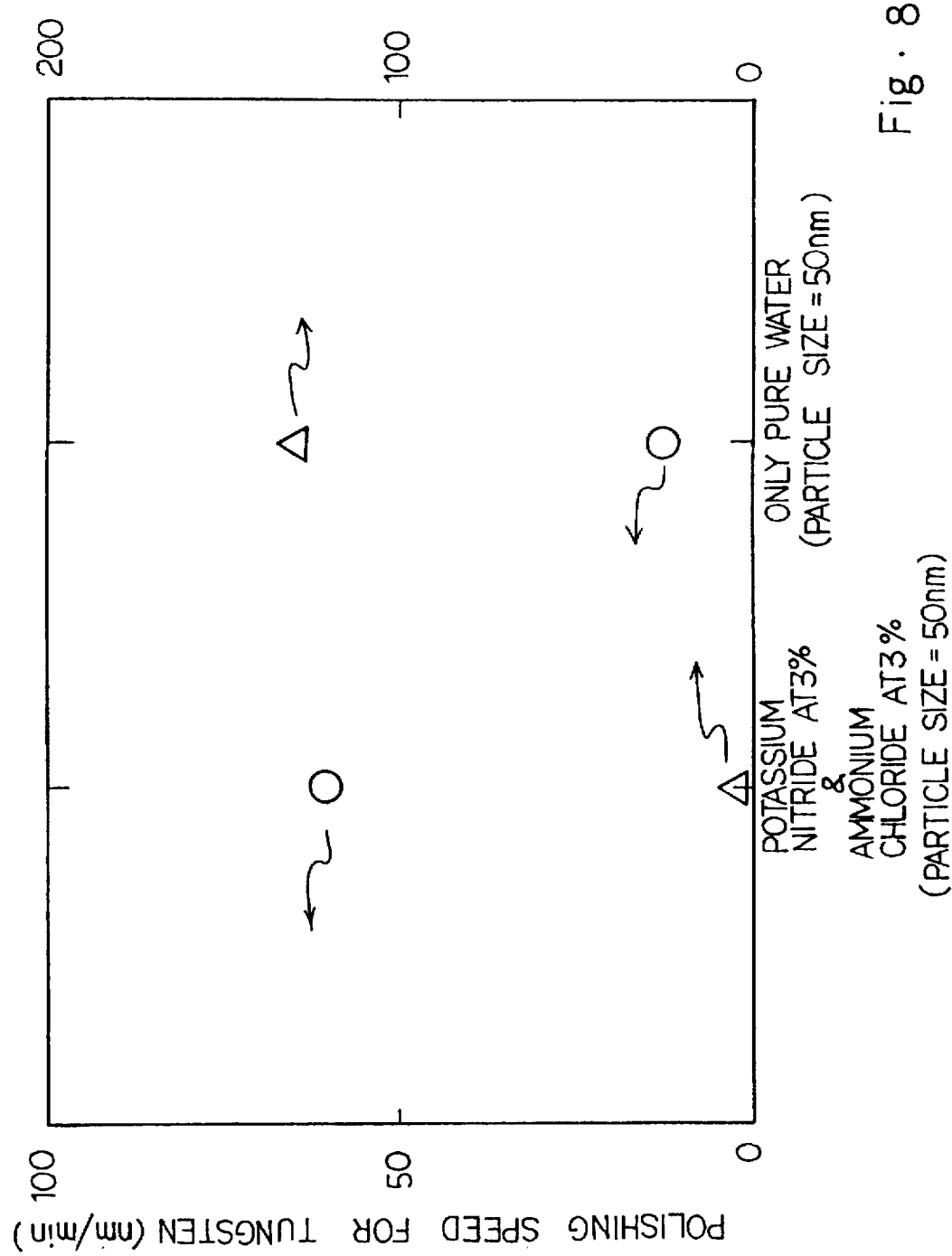
FIG. 8 is a graph showing influence of additives contained in polishing slurry.

The polishing is moved from the first stage to the second stage without an interruption. The polishing conditions in the second stage are identical with the those of the first stage except for the contents of the polishing slurry. Although the particle size of the alumina is also 50 nanometers and the oxidant is $H_2O_2$, the polishing slurry in the second stage does not contain the dispersant. The oxidant is also $H_2O_2$. As a result, the polishing speed is decreased to 15 nm/min as indicated by right small circle in FIG. 8. The polishing speed is decreased to about 30 percent of the first stage, and the polishing conditions are changed from severe to mild. In FIG. 8, small triangles are representative of the polishing speed for the insulating layer 22b.

The present inventor evaluated the two-stage polishing implementing the fourth embodiment. Upon completion of the second stage of the polishing, the shallow recess, the scratches and the step were not observed. Moreover, the present inventor replaced the additives to another inorganic additive such as phosphoric acid or organic additive or organic additives such as organic salt, i.e., potassium phthalate, ammonium phthalate etc. serving as dispersant, and confirmed that the smooth top surface was created. The present inventor changed the oxidant from $H_2O_2$ to another one such as potassium iodate or iron nitride, and achieved the same result.

Although particular embodiments of the present invention have been shown and described, it will be obvious to those skilled in the art that various changes and modifications may be made without departing from the spirit and scope of the present invention.

For example, the processes according to the present invention may be used for a wiring structure fabricated on an insulating substrate.

The polishing condition is not limited to the polishing speed, the particle size, the hydrogen ion concentration and the additives. At least two of the polishing conditions may be concurrently changed during the chemical mechanical polishing.

The conductive metal such as tungsten may be selectively grown in a contact hole.

The metal/alloy layer may be polished more than twice under different conditions.

What is claimed is:

1. A process of fabricating a wiring structure, comprising the steps of:
   a) forming at least one opening in an inter-level insulating layer over a substrate;
   b) growing conductive metal in said at least one opening in such a manner that a piece of said conductive metal has a projection over an upper surface of said inter-level insulating layer;
   c) polishing an upper portion of said projection under severe conditions; and
   d) polishing a remaining portion of said projection under mild conditions until said piece of said conductive metal becomes coplanar with said upper surface of said inter-level insulating layer.

2. The process as set forth in claim 1, in which the condition to be changed from severe to mild is a polishing speed, and the polishing speed in said step d) is equal to or less than 70 percent of the polishing speed in said step c).

3. The process as set forth in claim 2, in which said polishing speed in said step c) and said polishing speed in said step d) range between 150 nanometers per minute and 400 nanometers per minute and between 50 nanometers per minute and 100 nanometers per minute, respectively.

4. The process as set forth in claim 2, in which said polishing speed is regulated by changing a rotation of a polishing pad to which said projection is pressed.

5. The process as set forth in claim 1, in which the condition to be changed from severe to mild is a particle size of polishing powder contained in polishing slurry supplied between said projection and a rotating polishing pad to which said projection is pressed, and the particle size of the polishing slurry used in said d) is equal to or less than 50 percent of the particle size of the polishing powder used in said step c).

6. The process as set forth in claim 5, in which said particle size of said polishing powder used in said step c) and said particle size of said polishing powder used in said step d) range between 150 nanometers and 200 nanometers and between 20 nanometers and 100 nanometers, respectively.

7. The process as set forth in claim 5, in which said polishing powder is formed of alumina.

8. The process as set forth in claim 1, in which the condition to be changed from severe to mild is the hydrogen ion concentration of a polishing slurry supplied between said projection and a rotating polishing pad to which said projection is pressed, and the pH value of the polishing slurry used in said step d) is greater than the pH value of the polishing slurry used in said step c).

9. The process as set forth in claim 8, in which said pH value of said polishing slurry used in said step c) and said pH value of said polishing slurry used in said step d) range between 3 and 5 and between 7 and 14, respectively.

10. The process as set forth in claim 1, in which the condition to be changed from severe to mild is the amount of additive added to a polishing slurry supplied between said projection and a rotating polishing pad to which said projection is pressed, and the amount of said additive mixed into said polishing slurry used in said step c) is more than the amount of said additive mixed into said polishing slurry used in said step d).

11. The process as set forth in claim 10, in which said additive serves as a dispersant.

12. The process as set forth in claim 11, in which said dispersant is formed of potassium nitride and ammonium chloride.

13. A process of fabricating a wiring structure, comprising the steps of:
   a) forming at least one opening in an inter-level insulating layer over a substrate;
   b) growing conductive metal in said at least one opening in such a manner that a piece of said conductive metal has a projection over an upper surface of said inter-level insulating layer;
   c) polishing an upper portion of said projection at a high speed; and
   d) polishing a remaining portion of said projection at a low speed until said piece of said conductive metal becomes coplanar with said upper surface of said inter-level insulating layer.

* * * * *